United States Patent
Jung et al.

(10) Patent No.: US 9,385,157 B2
(45) Date of Patent: Jul. 5, 2016

(54) PIXEL OF AN IMAGE SENSOR, AND IMAGE SENSOR

(71) Applicant: SAMSUNG ELECTRONICS CO., LTD., Suwon-Si, Gyeonggi-Do (KR)

(72) Inventors: Young-Woo Jung, Yongin-Si (KR); Jung-Chak Ahn, Yongin-Si (KR); Hee-Geun Jeong, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/633,381

(22) Filed: Feb. 27, 2015

(65) Prior Publication Data

US 2016/0013240 A1    Jan. 14, 2016

(30) Foreign Application Priority Data

Jul. 11, 2014    (KR) .................. 10-2014-0087567

(51) Int. Cl.
   *H01L 27/146*    (2006.01)

(52) U.S. Cl.
   CPC ...... *H01L 27/14645* (2013.01); *H01L 27/1461* (2013.01); *H01L 27/1464* (2013.01); *H01L 27/14614* (2013.01); *H01L 27/14616* (2013.01); *H01L 27/14621* (2013.01); *H01L 27/14627* (2013.01); *H01L 27/14638* (2013.01); *H01L 27/14641* (2013.01); *H01L 27/14689* (2013.01)

(58) Field of Classification Search
   CPC ............... H01L 27/14645; H01L 27/1461
   See application file for complete search history.

(56) References Cited

U.S. PATENT DOCUMENTS

| | | | |
|---|---|---|---|
| 7,095,440 B2 | 8/2006 | Fossum | |
| 7,435,668 B2 | 10/2008 | Machida et al. | |
| 8,003,424 B2 | 8/2011 | Lee et al. | |
| 8,247,854 B2 | 8/2012 | Kang | |
| 8,415,189 B2 | 4/2013 | Kwon et al. | |
| 8,507,372 B2 | 8/2013 | Papasouliotis et al. | |
| 8,531,567 B2 | 9/2013 | Roy et al. | |
| 2010/0110239 A1 | 5/2010 | Ramappa et al. | |
| 2011/0079832 A1* | 4/2011 | Masagaki | H01L 27/14609 257/291 |
| 2011/0108897 A1* | 5/2011 | Koo | H01L 27/14609 257/292 |
| 2013/0105875 A1 | 5/2013 | Kim | |
| 2013/0248954 A1 | 9/2013 | Ahn | |
| 2014/0001527 A1 | 1/2014 | Myung | |

FOREIGN PATENT DOCUMENTS

| | | |
|---|---|---|
| JP | 2011044544A A | 3/2011 |
| KR | 100837271B B | 6/2008 |
| KR | 1020130106978A A | 1/2013 |
| KR | 20130047409A A | 5/2013 |

* cited by examiner

*Primary Examiner* — Su C Kim
*Assistant Examiner* — David S Wilbert
(74) *Attorney, Agent, or Firm* — Volentine & Whitt, PLLC

(57) ABSTRACT

A pixel of an image sensor includes a photoelectric conversion region formed in a semiconductor substrate, a floating diffusion region formed in the semiconductor substrate, the floating diffusion region being spaced apart from the photoelectric conversion region, a vertical transfer gate extending from a first surface of the semiconductor substrate into a recess in the semiconductor substrate, and configured to form a transfer channel between the photoelectric conversion region and the floating diffusion region, and an impurity region surrounding the recess. The impurity region has a first impurity concentration at a region adjacent to a side of the recess, and a second impurity concentration higher than the first impurity concentration at a region adjacent to the bottom of the recess.

20 Claims, 15 Drawing Sheets

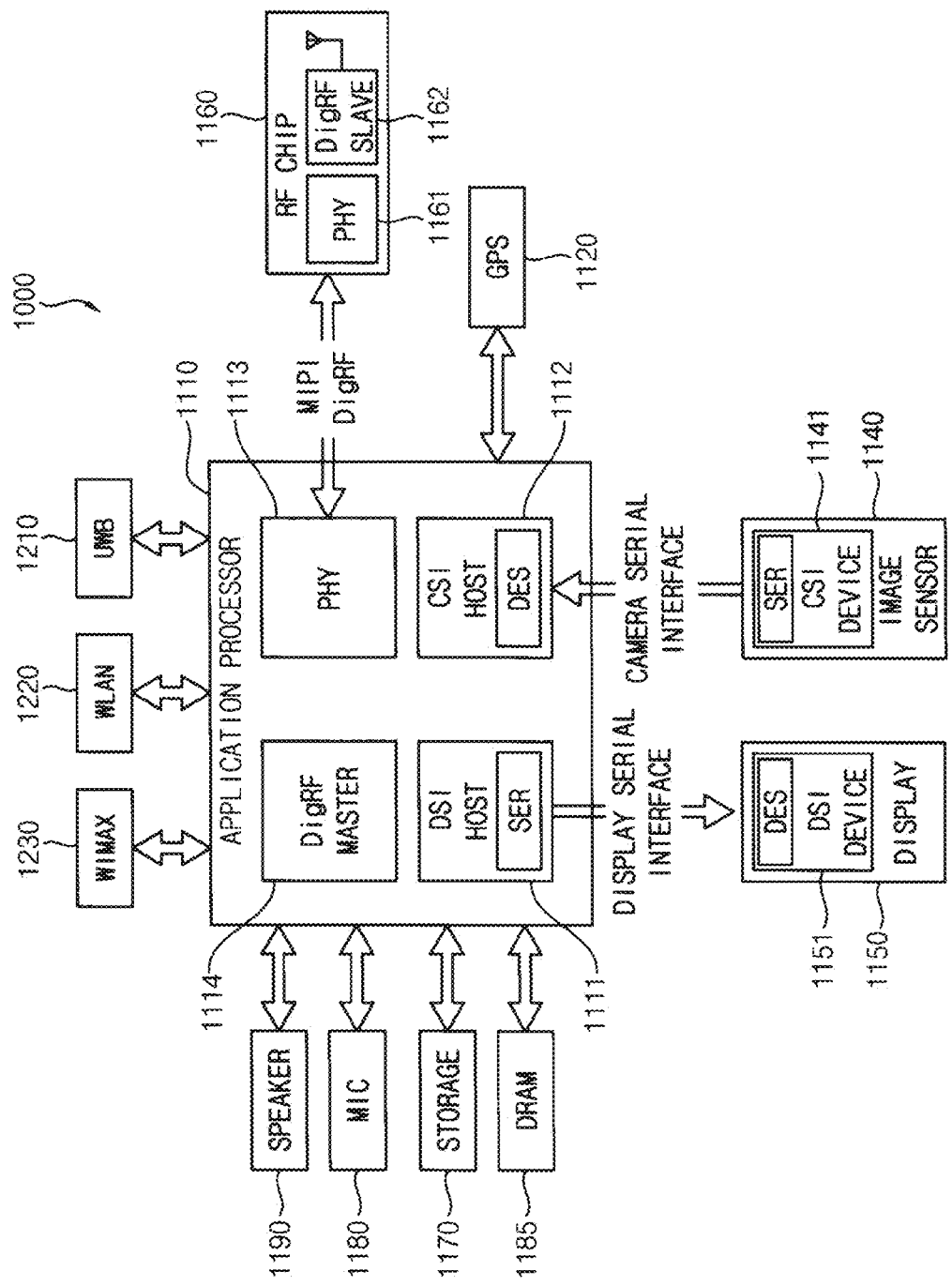

PIXEL OF AN IMAGE SENSOR, AND IMAGE SENSOR

CROSS-REFERENCE TO RELATED APPLICATIONS

This U.S. non-provisional application claims the benefit of priority under 35 U.S.C. §119 to Korean Patent Application No. 10-2014-0087567 filed on Jul. 11, 2014 in the Korean Intellectual Property Office (KIPO), the entire contents of which are hereby incorporated by reference in their entirety.

BACKGROUND

1. Technical Field

The inventive concept relates generally to image sensors. More particularly, the inventive concept relates to pixels of image sensors including vertical transfer gates.

2. Description of the Related Art

An image sensor is a semiconductor device that converts a photo image (e.g., light reflected by the subject) into an electric signal and thus is widely used in portable electronic devices, such as digital cameras, cellular phones, etc. Generally, image sensors may be classified as charged coupled device (CCD) image sensors and complementary metal oxide semiconductor (CMOS) image sensors. Recently, a backside illumination (BSI) image sensor that receives incident light on its back surface has been developed to improve light reception efficiency and light sensitivity of the image sensor.

SUMMARY

According to one aspect of the inventive concept, there is provided a pixel of an image sensor including a photoelectric conversion region in a semiconductor substrate, a floating diffusion region in the semiconductor substrate, the floating diffusion region being spaced apart from the photoelectric conversion region, a vertical transfer gate extending from a first surface of the semiconductor substrate into a recess in the semiconductor substrate and operable to form a transfer channel between the photoelectric conversion region and the floating diffusion region, and an impurity region surrounding the recess. The impurity region has a first impurity concentration at a region adjacent to a side of the recess, and having a second impurity concentration higher than the first impurity concentration adjacent a bottom of the recess.

According to another aspect of the inventive concept, there is provided a pixel array including a semiconductor substrate having first and second opposite major surfaces, and a recess extending into the substrate from the first surface, a photodetector adjacent the bottom of the recess, and a vertical transfer gate extending into the recess, and in which the substrate has a floating diffusion region adjacent the side of the recess, and an impurity region delimiting the bottom and side of the recess so as to be interposed between the vertical transfer gate and the floating diffusion region and so as to provide a channel from the photodetector adjacent the bottom of the recess to the floating diffusion region. The impurity region is of a first conductivity type, and the floating diffusion region is of a second conductivity type different from the first conductivity type. Furthermore, the impurity region contains an impurity at a first concentration in a portion thereof delimiting the side of the recess, and at a second concentration in a portion thereof delimiting bottom of the recess. The second concentration is greater than the first concentration.

According to still another aspect of the inventive concept, there is provided a image sensor having a pixel array including a plurality of pixels, and a control unit configured to control the pixel array, and in which each pixel includes a photoelectric conversion region in a semiconductor substrate, a floating diffusion region located in the semiconductor substrate and spaced apart from the photoelectric conversion region, a vertical transfer gate extending from a first surface of the semiconductor substrate into a recess in the semiconductor substrate and operable to form a transfer channel between the photoelectric conversion region and the floating diffusion region, and an impurity region surrounding the recess. The impurity region has a first impurity concentration at a region adjacent to a side of the recess, and a second impurity concentration higher than the first impurity concentration adjacent a bottom of the recess.

BRIEF DESCRIPTION OF THE DRAWINGS

Illustrative, non-limiting example embodiments will be more clearly understood from the following detailed description taken in conjunction with the accompanying drawings.

FIG. 14 is a block diagram of an electronic device having several interfaces, according to the inventive concept.

DETAILED DESCRIPTION OF EXAMPLE EMBODIMENTS

Figure 1:
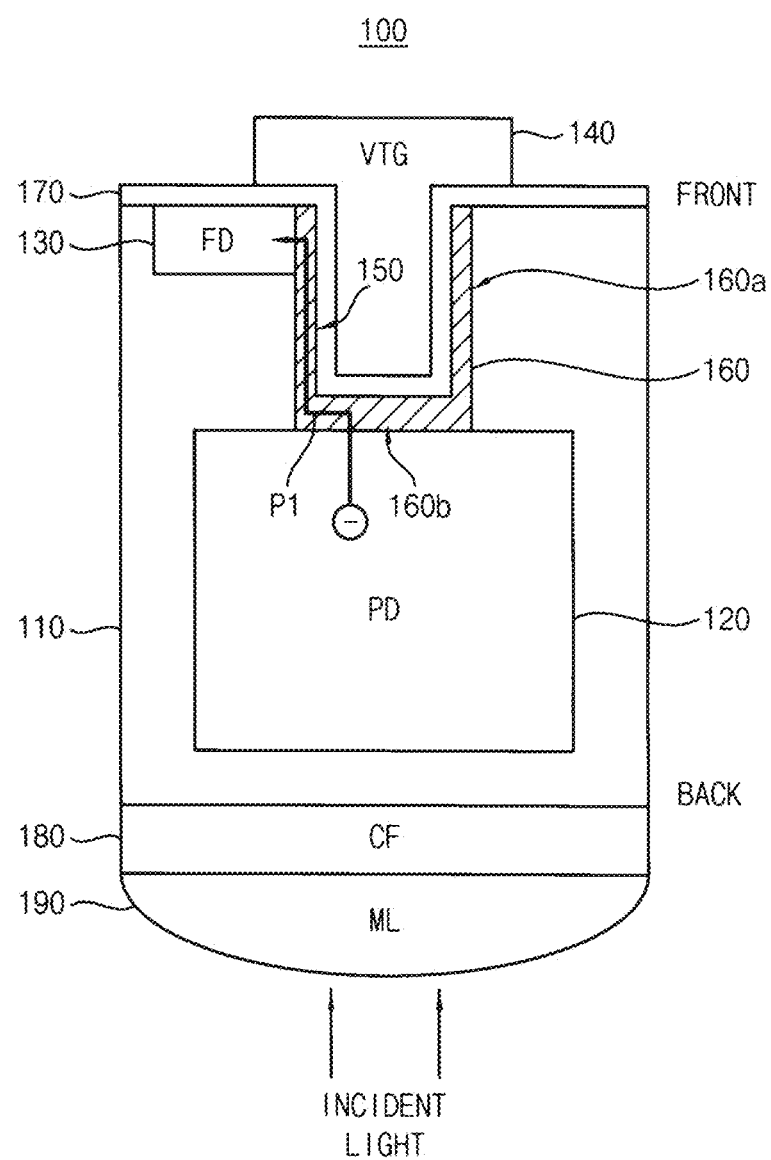
FIG. 1 is a cross-sectional schematic diagram of a pixel of an image sensor according to the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be Furthermore understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, the term "semiconductor substrate" may refer to any bulk material or layer of semiconductor material that serves as a substrate and which, in the context of the inventive concept, may have various regions provided with impurities so as to have electrical properties/characteristics different from that of the unaltered semiconductor material.

A pixel of an image sensor according to the inventive concept will now be described in detail with reference to the schematic sectional view of FIG. 1 and the graph of FIG. 2.

Referring to FIG. 1, a pixel 100 of an image sensor includes a semiconductor substrate 110, a photoelectric conversion region 120, a floating diffusion region 130, a vertical transfer gate 140 and an impurity region 160. The pixel 100 may additionally include a gate insulation layer 170, a color filter 180 and a micro lens 190, and at least one transistor, such as a reset transistor, a drive transistor, a select transistor, or the like.

The semiconductor substrate 110 may have a first surface FRONT and a second surface BACK opposite to the first surface FRONT. In an example of this embodiment, an image sensor including the pixel 100 is a backside illumination (BSI) image sensor. In this case, the vertical transfer gate 140 and/or other transistors may be formed on the first surface FRONT (e.g., a front surface) of the semiconductor substrate 110, and incident light may reach the photoelectric conversion region 120 through the second surface BACK (e.g., a back surface) of the semiconductor substrate 110. Also, in an example of this embodiment, the semiconductor substrate 110 comprises a semiconductor layer formed by an epitaxial process.

The photoelectric conversion region 120 may be formed in semiconductor substrate 110, and may generate charges (e.g., photo-charges) based on the incident light. For example, electron-hole pairs may be generated in response to the incident light, and the photoelectric conversion region 120 may collect the electrons or holes. To this end, the photoelectric conversion region 120 may include a pinned photodiode (PPD), a photodiode (PD), a phototransistor, a photogate, or a combination of such components.

Although FIG. 1 illustrates an example in which the photoelectric conversion region 120 contacts the impurity region 160, as an alternative, the photoelectric conversion region 120 may be spaced apart by a predetermined distance from the impurity region 160. In another example of this embodiment, a top surface of the photoelectric conversion region 120 may be located above the level of a bottom surface of the vertical transfer gate 140, i.e., at least a portion of the impurity region 160 and the vertical transfer gate 140 may extend in the photoelectric conversion region 120. Furthermore, although FIG. 1 illustrates an example in which the photoelectric conversion region 120 is spaced apart from the second surface BACK of the semiconductor substrate 110, in another example of this embodiment, the photoelectric conversion region 120 extends to the second surface BACK of the semiconductor substrate 110.

The floating diffusion region 130 may be formed in the semiconductor substrate 110, and may be spaced apart from the photoelectric conversion region 120. The vertical transfer gate 140 may transfer the charges generated at the photoelectric conversion region 120 to the floating diffusion region 130, and the floating diffusion region 130 may store the transferred charges. In an example of this embodiment, the floating diffusion region 130 is doped with an impurity of a second conductivity type (e.g., an N type).

Figure 5:
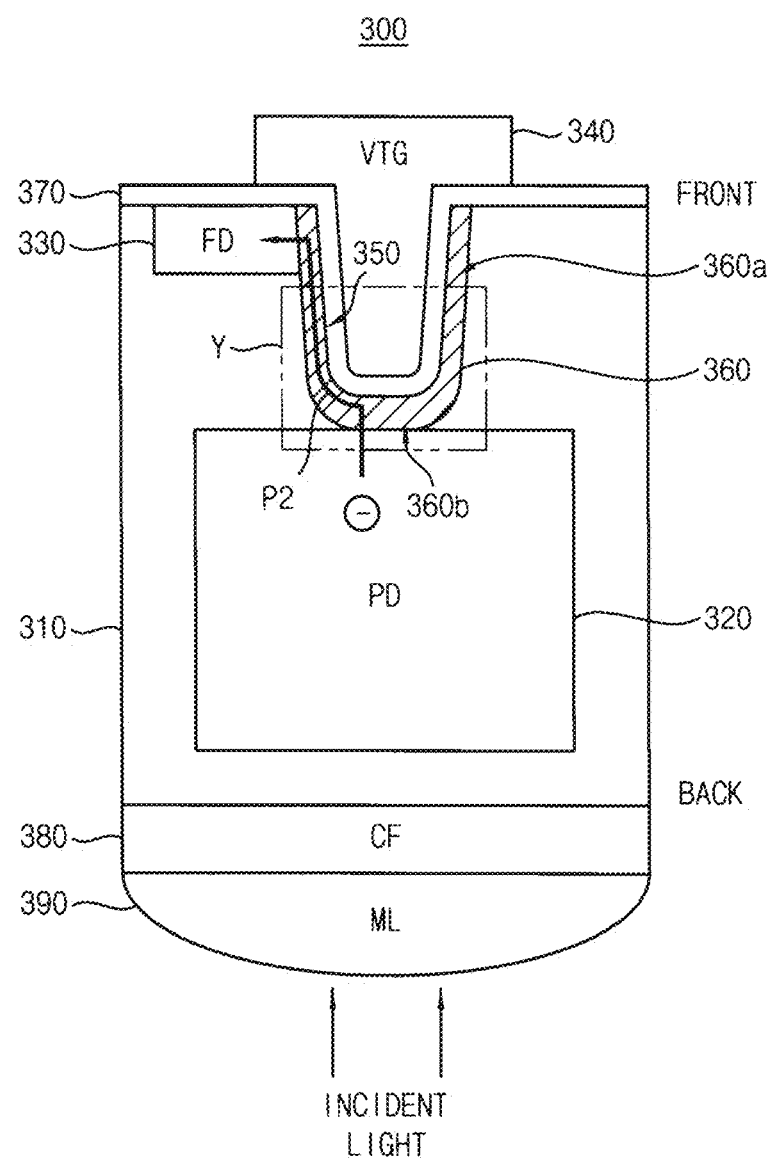
FIG. 5 is a cross-sectional diagram of another embodiment of a pixel of an image sensor according to the inventive concept.
Figure 6:
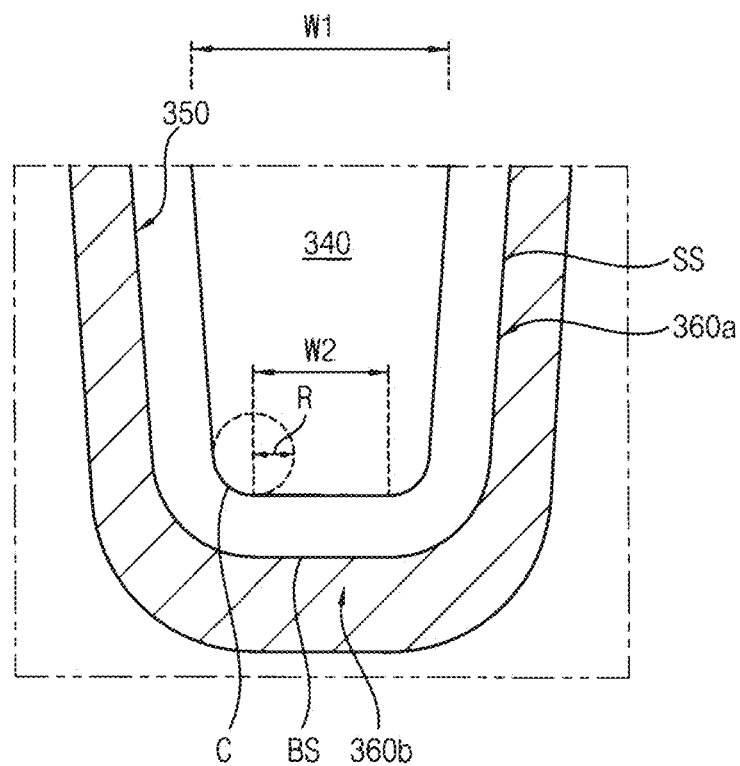
FIG. 6 is an enlarged view of portion "Y" of the pixel in FIG. 5.

The vertical transfer gate 140 may extend from the first surface FRONT of the semiconductor substrate 110 into a recess 150 in the semiconductor substrate 110. For example, the vertical transfer gate 140 extends along the first surface FRONT of the semiconductor substrate 110 and inside the recess 150, and thus may have a T-shaped vertical cross section. To transfer the charges generated at the photoelectric conversion region 120 to the floating diffusion region 130, the vertical transfer gate 140 may form a transfer channel between the photoelectric conversion region 120 and the floating diffusion region 130 in response to a transfer signal. The vertical transfer gate 140 may have a buried region in the recess 150 such that the buried region is surrounded by the semiconductor substrate 110, and the transfer channel may be a vertical transfer channel adjacent to a side surface of the buried region. In an example of this embodiment, as illustrated in FIG. 1, the buried region of the vertical transfer gate 140 may have a corner (e.g., a substantially right-angled corner) where a bottom surface of the buried region and a side surface of the buried region intersect. In other embodiments, as illustrated in FIGS. 5 and 6, the buried region of the vertical transfer gate 140 may have a rounded corner between the bottom surface of the buried region and the side surface of the buried region. The radius of curvature of the rounded corner may range from about 10 nm to about 100 nm, for example.

The impurity region 160 may surround the recess 150, and may contain an impurity of a first conductivity type (e.g., a P type). Thus, the impurity region 160 may be disposed adjacent the channel region of the vertical transfer gate 140 in which the transfer channel is formed. The impurity region 160 has a first impurity concentration at a region 160a adjacent to the sides of the recess 150, and a second impurity concentration higher than the first impurity concentration at a region 160b adjacent to the bottom of the recess 150. Accordingly, a potential barrier (or a potential hump) is virtually non-existent in the transfer channel of the vertical transfer gate 140 along a charge transfer path P1 from the photoelectric conversion region 120 to the floating diffusion region 130.

Figure 2:
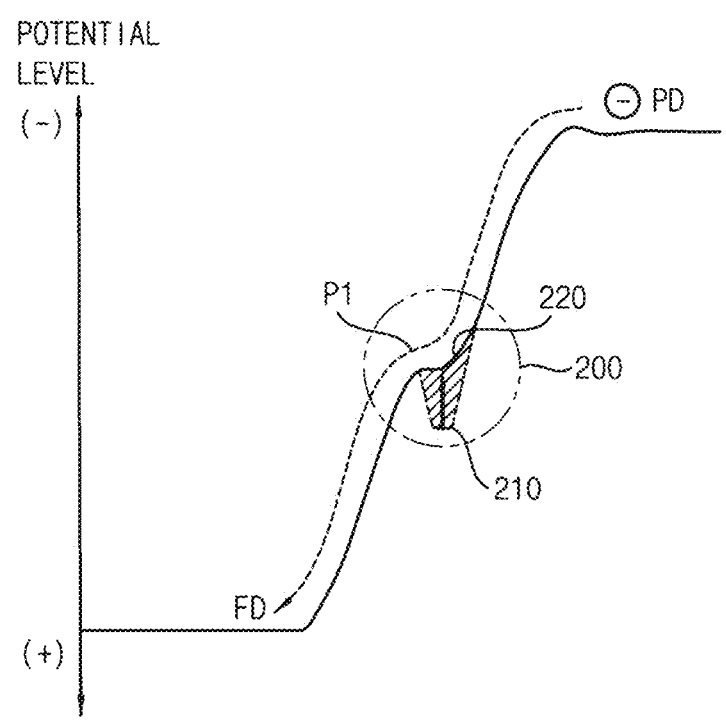
FIG. 2 is a graph of a potential level of a charge transfer path in the pixel of FIG. 1.

For example, as illustrated in FIG. 2, when the vertical transfer gate 140 is turned on, the charges generated at the photoelectric conversion region (PD) 120 may be transferred to the floating diffusion region (FD) 130 along the charge transfer path P1 from the photoelectric conversion region (PD) 120 to the floating diffusion region (FD) 130. In a conventional pixel including a vertical transfer gate, the potential 210 at a region adjacent to the bottom of a recess into which the transfer gate extends is significantly higher (or located relatively low in the graph of FIG. 2) than that at a region adjacent to a corner between the bottom and sides of the recess. Accordingly, the charge transfer from a photoelectric conversion region to a floating diffusion region in a conventional pixel may be delayed. However, in the embodiments of the pixel 100 of the image sensor according to the inventive concept, the potential 210 at the region 160b adjacent to the bottom of the recess 150 may be in effect decreased (or located relatively high in the graph of FIG. 2) to a predetermined potential 220 because the impurity region 160 has a first impurity concentration at the region 160a adjacent to the side of the recess 150, and a second impurity concentration higher than the first impurity concentration at the region 160b adjacent to the bottom of the recess 150. Accordingly, in embodiments of the pixel 100 according to the inventive concept, the potential barrier 200 is virtually non-existent, thereby improving transfer performance of the vertical transfer gate 140 and preventing a transfer delay and an image lag.

Referring back to FIG. 1, gate insulation layer 170 may be interposed between the vertical transfer gate 140 and the impurity region 160. Thus, the gate insulation layer 170 may extend along surfaces that delimit the recess 150. Furthermore, the gate insulation layer 170 may extend along the first surface FRONT of the semiconductor substrate 110. The gate insulation layer 170 may electrically insulate the vertical transfer gate 140 and the semiconductor substrate 110.

The color filter 180 may be provided in association with the photoelectric conversion region 120 on the second surface BACK of the semiconductor substrate 110. The color filter 180 may be just one filter in a color filter array in which color filters are arranged in a matrix. In an example of this embodiment, the color filter array may be a Bayer filter including an array of red, green and blue filters. In other example embodiments, the color filter array may include a yellow filter, a magenta filter and a cyan filter. Furthermore, the color filter array may additionally include a white filter. In an example of this embodiment, an anti-reflection layer and at least one insulation layer are interposed between the second surface BACK of the semiconductor substrate 110 and the color filter 180.

The micro lens 190 may be disposed on the color filter 180 in association with the photoelectric conversion region 120. The micro lens 190 may focus the incident light on the photoelectric conversion region 120. The micro lens 190 may be just one lens in a micro lens array in which micro lenses are arranged in a matrix.

Figure 8:
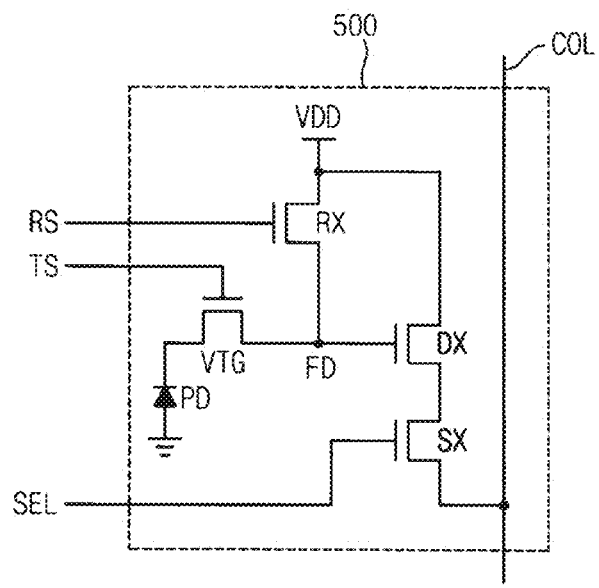
FIG. 8 is a circuit diagram of an example of a transistor-based pixel structure of an image sensor according to the inventive concept.
Figure 9:
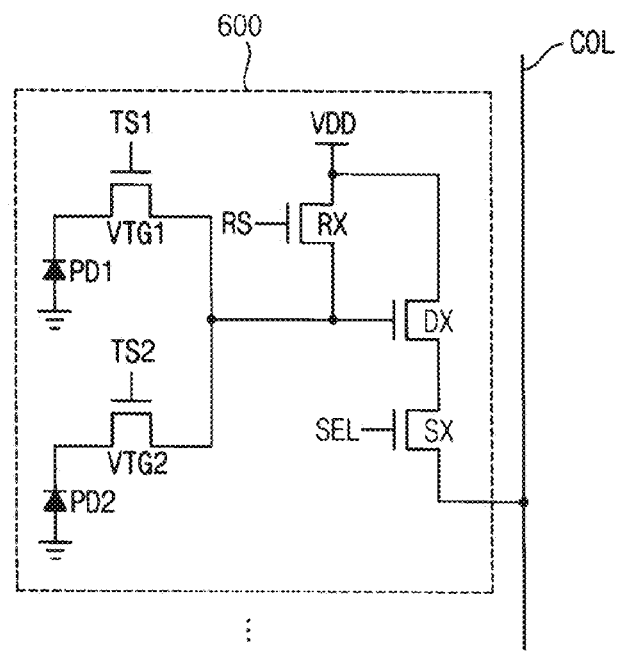
FIG. 9 is a circuit diagram of another example of a transistor-based pixel structure of an image sensor according to the inventive concept.

Image sensors having a pixel 100 according to the inventive concept may have various transistor-based structures, such as a 1-transistor structure, a 3-transistor structure, a 4-transistor structure, or a 5-transistor structure. Also, in one example of this embodiment, at least one transistor is shared by adjacent pixels. For example, as illustrated in FIG. 8, the pixel 100 of the image sensor may include a reset transistor RX that resets the floating diffusion region (FD) 130 in response to a reset signal RS, a drive transistor DX that generates an output signal corresponding to charges charged in the floating diffusion region (FD) 130, and a select transistor SX that outputs the output signal in response to a selection signal SEL. In an example of this embodiment, as illustrated in FIG. 9, the reset transistor RX, the drive transistor DX and the select transistor SX may be shared by adjacent pixels.

In an example of an image sensor having pixels according to the inventive concept, a deep trench isolation (DTI) structure in a common substrate (semiconductor substrate 110) is configured to surround each pixel 100. The DTI structure may extend a predetermined depth into the substrate from the first surface FRONT of the semiconductor substrate 110 so as to terminate at a location spaced from the second surface BACK of the semiconductor substrate 110, or may extend through the semiconductor substrate 110 from the first surface FRONT of the semiconductor substrate 110 to the second surface BACK of the semiconductor substrate 110. In other examples, the DTI structure may extend from the second surface BACK of the semiconductor substrate 110 a predetermined depth or to the first surface FRONT of the semiconductor substrate 110. In any case, the DTI structure may include an insulation material, such as a silicon oxide (SiOx), a silicon nitride (SiNx), or a hafnium oxide (HfOx). In these examples in which each pixel 100 is separated from adjacent pixels by the DTI structure, optical and/or electrical crosstalk between the pixels may be prevented.

As described above, in the pixel 100 of the image sensor according to the inventive concept, the impurity region 160 surrounds the recess 150 into which a buried portion of the vertical transfer gate 140 extends, and the impurity concentration at the region 160b adjacent to the bottom of the recess 150 is higher than the impurity concentration at the region 160a adjacent to a side of the recess 150. Accordingly, the potential barrier at the transfer channel of the vertical transfer gate 140 may be obviated, performance of the vertical transfer gate 140 may be improved, and signal transfer delay and image lag may be prevented.

FIGS. 3A through 3G illustrate an embodiment of a method of manufacturing a pixel of an image sensor according to the inventive concept.

Figure 3A:
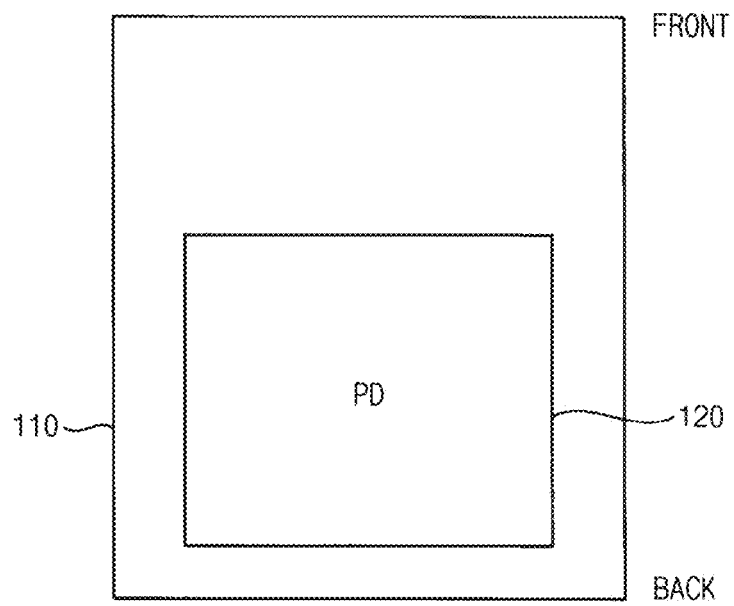
FIGS. 3A, 3B, 3C, 3D, 3E, 3f and 3G are each a schematic cross-sectional diagram of a pixel during the course of its manufacture, and together illustrate an example of a method of manufacturing a pixel of an image sensor according to the inventive concept.

Referring to FIG. 3A, a photoelectric conversion region 120 may be formed in a semiconductor substrate 110 having a first surface FRONT (e.g., a front surface) and a second surface BACK (e.g., a back surface). In an example of this embodiment, the photoelectric conversion region 120 is a photodiode PD containing impurities of a second conductivity type (e.g., an N type). Also, the photoelectric conversion region 120 may be formed by forming a plurality of regions having different impurity concentrations. For example, the photoelectric conversion region 120 may include a low concentration region having a relatively low impurity concentration adjacent to the second surface BACK of the semiconductor substrate 110, and a high concentration region having a relatively high impurity concentration on the low concentration region.

Figure 3B:
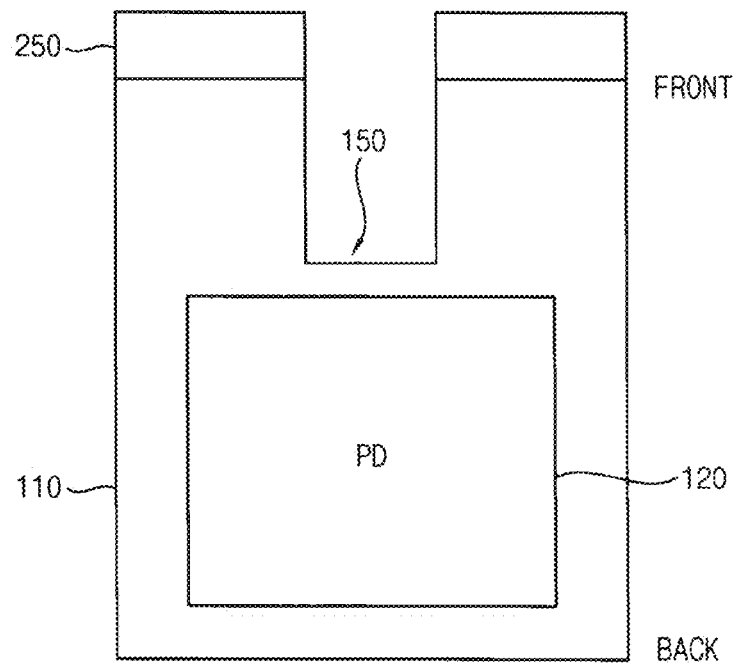

Referring to FIG. 3B, a mask pattern 250 is formed on the first surface FRONT of the semiconductor substrate 110 to form a recess 150. In an example of this embodiment, the recess 150 is formed by anisotropically etching the semiconductor substrate 110 using the mask pattern 250 as an etching mask. The width and depth of the recess 150 may be selected according to a desired shape of the vertical transfer gate 140 to be subsequently formed. Although FIG. 3B illustrates an example in which the recess 150 is spaced apart from the photoelectric conversion region 120, in other examples of this embodiment, the recess 150 may extend to the photoelectric conversion region 120, or may extend into the photoelectric conversion region 120.

Figure 3C:
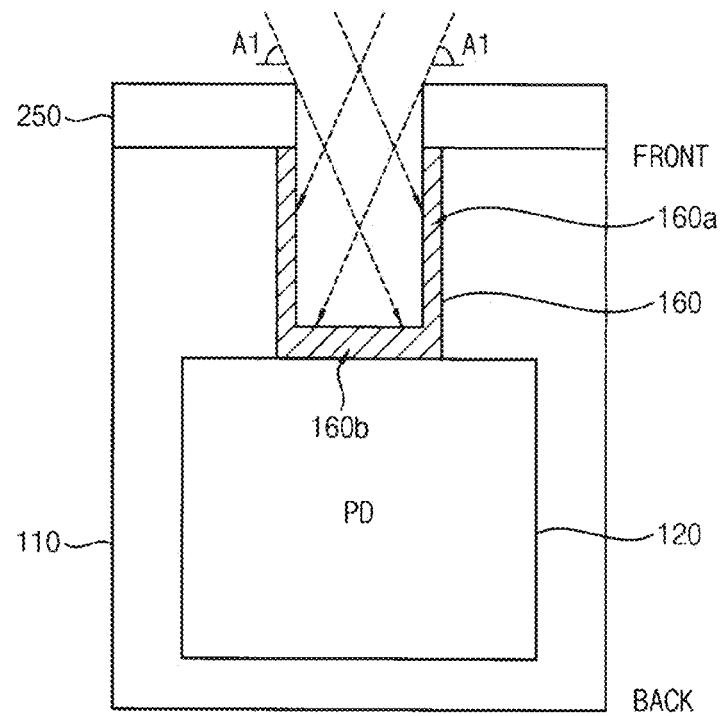
Figure 3D:
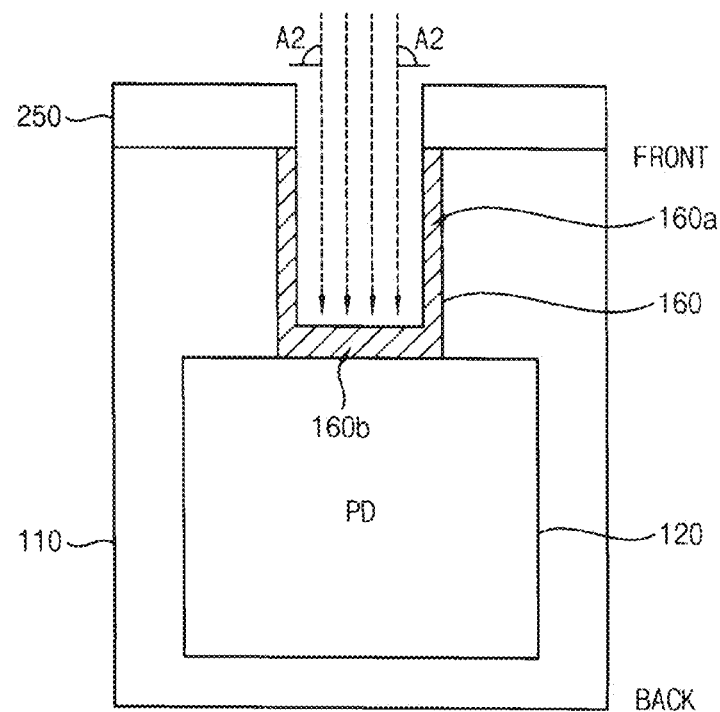

Referring to FIGS. 3C and 3D, an impurity region 160 is formed by implanting impurities at different implantation angles A1 and A2 with respect to a bottom of the recess 150 (using different ion implantation processes, for example, or different stages of an ion implantation process each implanting the impurities at a respective one of the angles). Thus, the impurity region 160 may have a first impurity concentration at a region 160a adjacent to sides of the recess 150, and may have a second impurity concentration higher than the first impurity concentration at a region 160b adjacent to the bottom of the recess 150.

For example, referring to FIG. 3C, an impurity (e.g., boron (B)) of a first conductivity type (e.g., a P type) may be implanted at a first implantation angle A1. In this case, the impurity of the first conductivity type is not be implanted into a region under the mask pattern 250 and remote from the recess 150, but is implanted only into a semiconductor region (i.e., 160) adjacent to the recess 150.

Referring to FIG. 3D, the impurity of the first conductivity type is also implanted at a second implantation angle A2 different from the first implantation angle A1. In an example of this embodiment, one of the second implantation angle A2 and the first implantation angle A1 is substantially perpendicular to the bottom of the recess 150 (or substantially perpendicular to the first surface FRONT of the semiconductor substrate 110), or may be about 90 degrees with respect to the surface delimiting the bottom of the recess 150. Accordingly, the region 160a adjacent to the sides of the recess 150 has the first impurity concentration, and the region 160b adjacent to the bottom surface of the recess 150 has the second impurity concentration higher than the first impurity concentration. The first and second implantation angles A1 and A2 may be determined based on the aspect ratio of the recess 150. Furthermore, the implantation may be carried out at more than two different implantation angles. In fact, the higher aspect ratio of the recess 150, the greater may be the number of the implantation angles. Furthermore, although FIGS. 3B through 3D illustrate an example in which the mask pattern 250 used as the etching mask during the entire process of forming the impurity region 160, in another example of this embodiment, a different ion implantation mask may be used for each instance in which ion implantation is carried out at a respective angle A1, A2, etc.

Figure 3E:
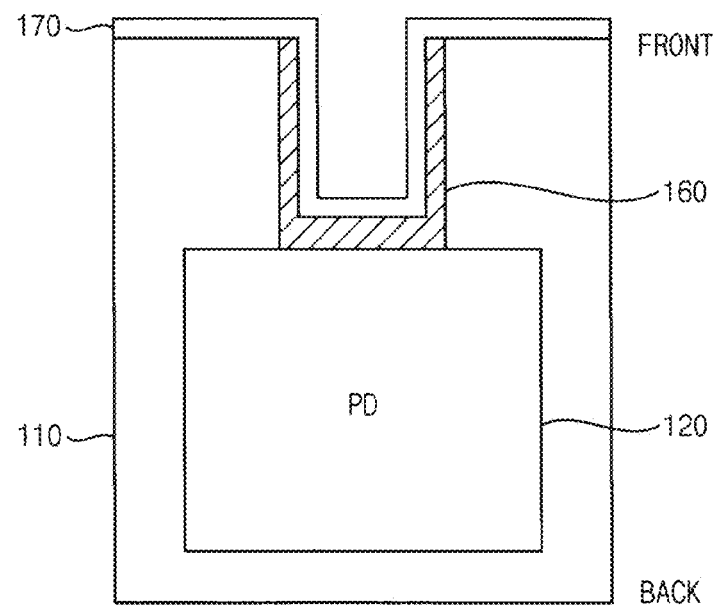

Referring to FIG. 3E, a gate insulation layer 170 may be formed on the semiconductor substrate 110 including within the recess 150. Thus, the gate insulation layer 170 may extend along the first surface FRONT of the semiconductor substrate 110 and along surfaces delimiting the recess 150. The gate insulation layer 170 may include a silicon oxide (SiOx), a silicon oxynitride (SiOxNy), a silicon nitride (SiNx), a germanium-silicon oxide (GeSixOy) or a material having a high permittivity. Although FIGS. 3C through 3E illustrate an example in which the gate insulation layer 170 is formed after the impurity region 160 is formed, in another example of this embodiment, the impurity region 160 is formed by the ion implantation process after the gate insulation layer 170 is formed.

Figure 3F:
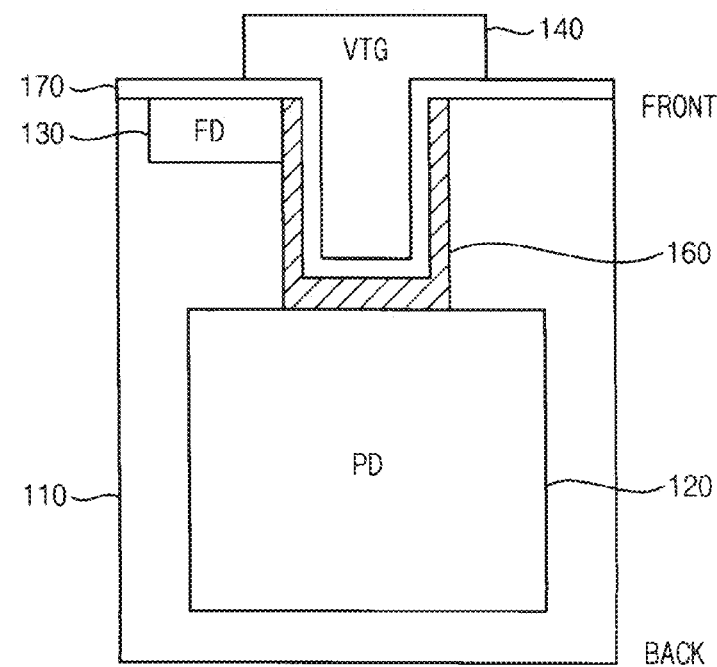

Referring to FIG. 3F, a vertical transfer gate 140 is formed on the gate insulation layer 170. For example, the vertical transfer gate 140 is formed to fill the recess 150, and to have a predetermined thickness on top of the first surface FRONT of the semiconductor substrate 110. In examples of this embodiment, the vertical transfer gate 140 includes polysilicon, a metal and/or a metal compound. For example, the vertical transfer gate 140 may be formed by forming at least one polysilicon layer and by implanting an impurity of a second conductivity (e.g., an N type) into the polysilicon layer. In an example of this embodiment, these processes may be carried out in stages, i.e., a forming of polysilicon and implanting of the impurities into the polysilicon may be sequentially repeated to fill the recess 150.

Figure 3G:
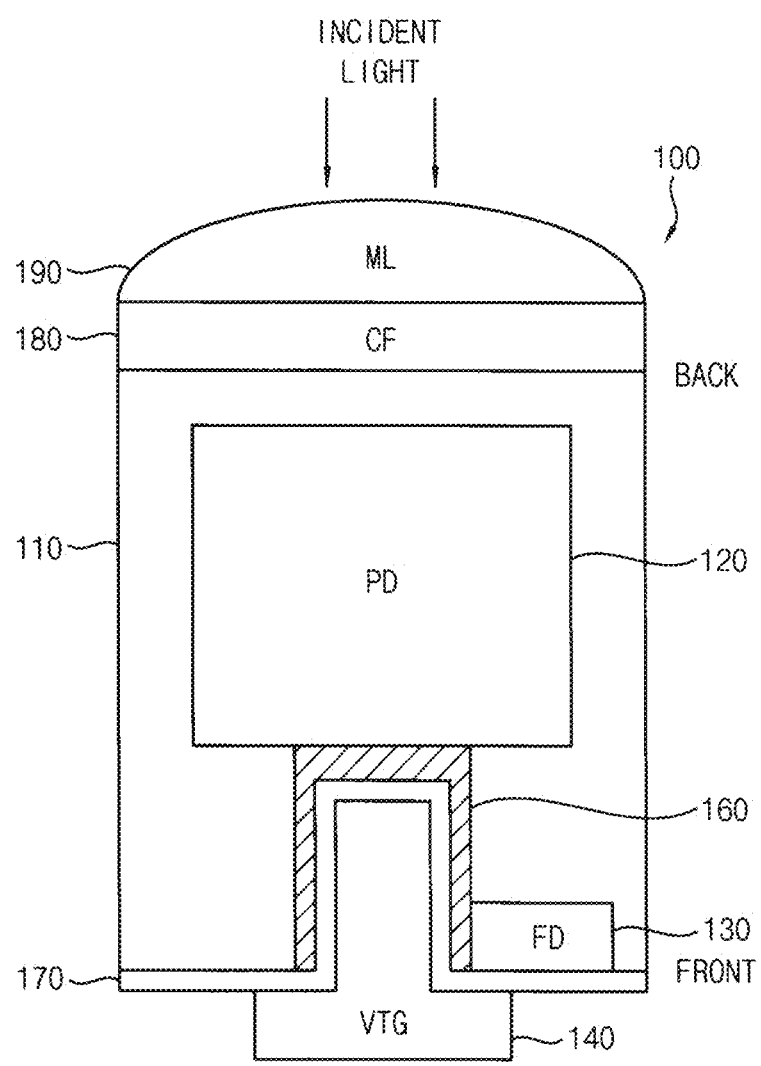

Referring to FIG. 3G a color filter 180 and a micro lens 190 may be formed on the second surface BACK of the semiconductor substrate 110. In an example of this embodiment, an anti-reflection layer, at least one insulation layer may be formed prior to this so that the layers are provided between the second surface BACK of the semiconductor substrate 110 and the color filter 180. The color filter 180 may be formed by a dyeing process, a pigment dispersion process, or a printing process. For example, the color filter 180 may be formed by spreading a photosensitive material, such as a dyed photoresist, and by performing light exposure and developing processes. The micro lens 190 may be formed to have a convex shape by forming a pattern corresponding to the photoelectric conversion region 120 using a light-transmissive photoresist and by reflowing the pattern. In an example of this embodiment, a planarization layer, such as an over-coating layer (OCL), may be formed on the color filter 180 before the micro lens is formed so as to be provided between the color filter 180 and the micro lens 190.

In the pixel 100 of the image sensor formed by the processes described above, the impurity region 160 is formed to surround the recess 150 in which at least a portion of the vertical transfer gate 140 is buried, and the impurity concentration at the region 160b adjacent to the bottom of the recess 150 is higher than the impurity concentration at the region 160a adjacent to a side of the recess 150. Accordingly, a potential barrier in the transfer channel of the vertical transfer gate 140 is obviated, the performance of the vertical transfer gate 140 is enhanced, and the transfer delay and the image lag may be prevented.

Figure 4:
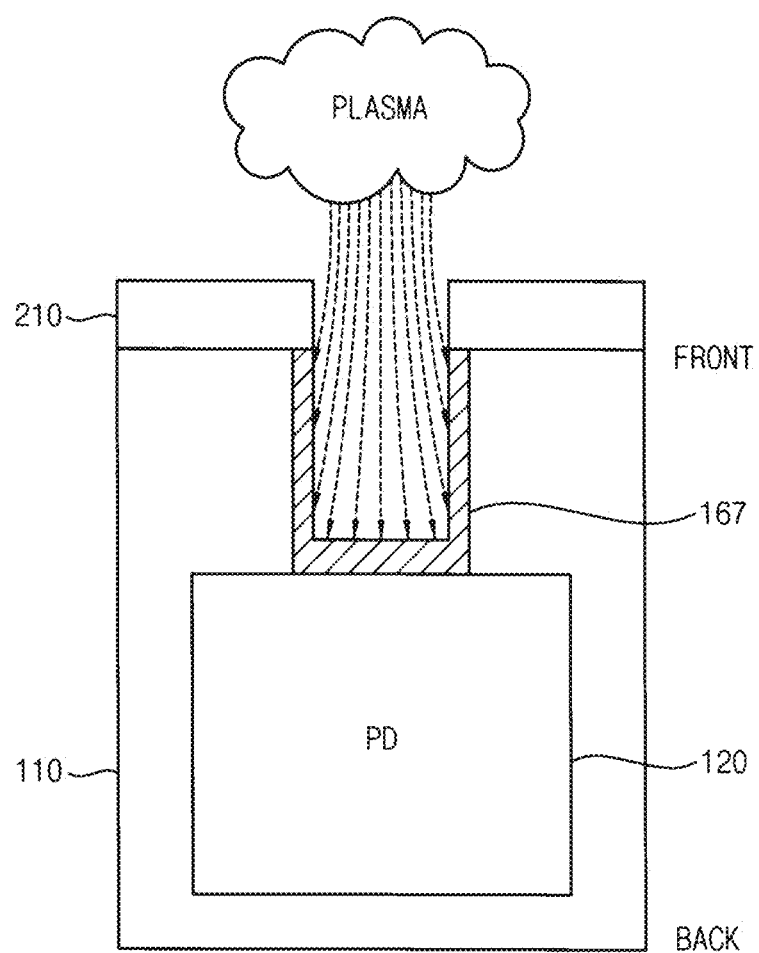
FIG. 4 is a schematic cross-sectional diagram of a pixel during the course of its manufacture, and together with previous figures illustrates another example of a method of manufacturing a pixel of an image sensor according to the inventive concept.

FIG. 4 is a cross-sectional view for use in describing another embodiment of a method of manufacturing a pixel of an image sensor according to the inventive concept.

Referring to FIG. 4, a plasma assisted doping (PLAD) process is used for implanting an impurity into an impurity region 167. This PLAD process may be performed along with at least one ion implantation process illustrated in FIGS. 3C and 3D. For example, the PLAD process may be performed before or after at least one ion implantation process illustrated in FIGS. 3C and 3D is performed. In an example of this embodiment, the PLAD process and the ion implantation process are simultaneously performed.

To perform the PLAD process, an ionizable impurity source gas of a first conductivity type (e.g., a P type) may be introduced into a process chamber. A plasma having a plasma sheath near a semiconductor substrate 110 may be generated in the process chamber. Ions in the plasma may be accelerated toward the semiconductor substrate 110 by a voltage pulse, and may be adhered to a surface of or implanted into the semiconductor substrate 110. Subsequently, the ions may be diffused into the semiconductor substrate 110, and thus in either case are implanted into the semiconductor substrate 110.

In the PLAD process, doping is performed with lower energy than a typical ion implantation process (e.g., a beam line ion implantation process), and thus the impurity is implanted to only a relatively small depth if at all, i.e., the impurity may form a shallow junction. Furthermore, even if the aspect ratio of the recess is high, the impurity may be provided by the PLAD process uniformly throughout the impurity region 167. Before or after this PLAD process, at least one ion implantation process is performed so that the impurity region 167 has a relatively high impurity concentration at a region adjacent to the bottom of the recess.

Figure 7:
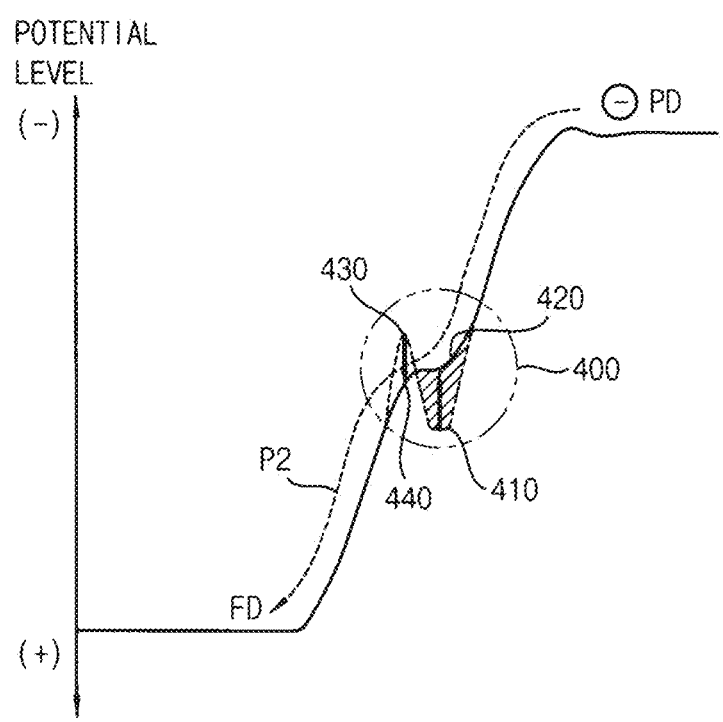
FIG. 7 is a graph illustrating a potential level of a charge transfer path in the pixel of FIG. 5.

FIGS. 5 and 6, referred to above, illustrate another embodiment of a pixel of an image sensor according to the inventive concept. FIG. 7 is a graph illustrating a potential level of a charge transfer path in the pixel of FIGS. 5 and 6.

Referring to FIG. 5, a pixel 300 of an image sensor includes a semiconductor substrate 310, a photoelectric conversion region 320, a floating diffusion region 330, a vertical transfer gate 340 and an impurity region 360. In an example of this embodiment, the pixel 300 may also include a gate insulation layer 370, a color filter 380 and a micro lens 390, and may additionally include at least one transistor, such as a reset transistor, a drive transistor, and a select transistor. The pixel 300 of FIG. 5 is similar to the pixel 100 of FIG. 1, except for the shape of the vertical transfer gate 340.

The vertical transfer gate 340 may include a buried region in a recess 350 in the semiconductor substrate 310 such that the buried region is surrounded by the semiconductor substrate 310, and the buried region of the vertical transfer gate 340 has a rounded corner between a bottom surface of the buried region and a side surface (e.g., an inclined side surface) of the buried region.

In an example of this embodiment, as illustrated in FIG. 6, the recess 350 has a rounded corner C between its bottom BS and its sides SS, and thus the buried region of the vertical transfer gate 340 may has a rounded corner C as well. In an example of this embodiment, a top portion of the buried region of the vertical transfer gate 340 may have a first width W1 greater than a second width W2 of the bottom of the buried region. For example, the second width W2 may be about a half of the first width W1. In examples of this embodiment, the radius R of curvature of the rounded corner C of the buried region of the vertical transfer gate 340 may be within about 10 nm to about 100 nm. In a case in which the radius R of curvature of the rounded corner C is lower than about 10 nm, a potential barrier may be formed. Furthermore, in a case in which the R of curvature of the rounded corner C is higher than about 100 nm, a problem may occur during a manufacturing process.

The impurity region 360 may be formed to surround the recess 350, and may contain an impurity of a first conductivity type (e.g., a P type). Furthermore, the impurity region 360 may have a first impurity concentration at a region 360a adjacent to a side of the recess 350, and may have a second impurity concentration higher than the first impurity concentration at a region 360b adjacent to a bottom of the recess 350. Accordingly, a potential barrier (or a potential hump) is virtually non-existent in a transfer channel of the vertical transfer gate 340 along a charge transfer path P2 from the photoelectric conversion region 320 to the floating diffusion region 330.

For example, as illustrated in FIG. 7, when the vertical transfer gate 340 is turned on, charges generated at the photoelectric conversion region (PD) 320 may be transferred to the floating diffusion region (FD) 330 along a charge transfer path P2 from the photoelectric conversion region (PD) 320 to the floating diffusion region (FD) 330. In a conventional pixel including a vertical transfer gate, a potential 410 at a region adjacent to a bottom of a recess in a substrate into which the transfer gate extends is higher (located relatively low in the graph of FIG. 7) than a potential at a region adjacent to a corner between the bottom and sides of the recess. Accordingly, the charge transfer from a photoelectric conversion region to a floating diffusion region may be delayed in the conventional pixel. However, in the pixel 300, the buried region of the vertical transfer gate 340 has the rounded corner C, and thus a potential 430 at a region adjacent to the corner C is in effect increased (or moved downward in the graph of FIG. 7) to a predetermined potential 440. Furthermore, the impurity region 360 has the first impurity concentration at the region 360a adjacent to the sides of the recess 350, and the second impurity concentration higher than the first impurity concentration at the region 360b adjacent to the bottom of the recess 350, and thus the potential 410 at the region 360b adjacent to the bottom of the recess 350 may be in effect decreased (or moved upward in the graph of FIG. 7) to a predetermined potential 420. Accordingly, a pixel 300 of the image sensor according to the inventive concept obviates a potential barrier 400, thereby enhancing the transfer performance of the vertical transfer gate 340 and preventing a transfer delay and an image lag.

FIG. 8 is a circuit diagram of an example of a pixel structure of an image sensor according to the inventive concept.

Referring to FIG. 8, each pixel structure 500 of an image sensor may include a pixel (of the embodiment of FIG. 1 or FIG. 5) having a photodiode PD as a photoelectric conversion region or a photo sensitive device, and may also include, as a readout circuit, a vertical transfer gate VTG, a reset transistor RX, a drive transistor DX and a select transistor SX. That is, in this example, each pixel is associated with a reset transistor RX, a drive transistor DX and a select transistor SX. In FIG. 8 (and FIG. 9 that follows), reference character VDD represents a supply voltage.

The photodiode PD may receive incident light, and may generate photo-charges based on the received light. The photo-charges generated at the photodiode PD may be transferred to a floating diffusion node FD by the vertical transfer gate VTG. For example, the vertical transfer gate VTG is turned on when a transfer signal TS has a first logic level (e.g., a high level), and the photo-charges generated at the photodiode PD may be transferred to the floating diffusion node FD through the turned-on vertical transfer gate VTG.

The drive transistor DX may serve as a source follower buffer amplifier, and may amplify a signal corresponding to charges accumulated in the floating diffusion node FD. The select transistor SX may transfer the amplified signal to a column line COL in response to a selection signal SEL. The floating diffusion node FD may be reset by the reset transistor RX. For example, to perform a correlated double sampling (CDS) operation, the reset transistor RX may discharge the floating diffusion node FD in response to a reset signal RS.

Although FIG. 8 illustrates an example in which the pixel structure has one photodiode PD and four gates or transistors VTG, RX, DX and SX, a transistor-based pixel structure according to the inventive concept is not limited to having four transistors, as was mentioned above, but may have other transistor configurations.

FIG. 9 illustrates another example of a pixel structure 600 of an image sensor according to the inventive concept.

Referring to FIG. 9, a reset transistor RX, a drive transistor DX and a select transistor SX may be shared by two or more pixels of the embodiment of FIG. 1 or FIG. 5. For example, two pixels may share the transistors RX, DX and SX. In this case, an image sensor including pixel structures 600 has a relatively high fill factor. In addition, transfer signals TS1 and TS2 applied to vertical transfer gates VTG1 and VTG2 may be activated in a time-division manner, and thus the photo-charges generated at respective photodiodes PD1 and PD2 may be independently or separately measured. Although FIG. 9 illustrates an example in which two pixels share the transistors RX, DX and SX, in other examples of this embodiment, at least one transistor may be shared by three or more pixels.

Figure 10:
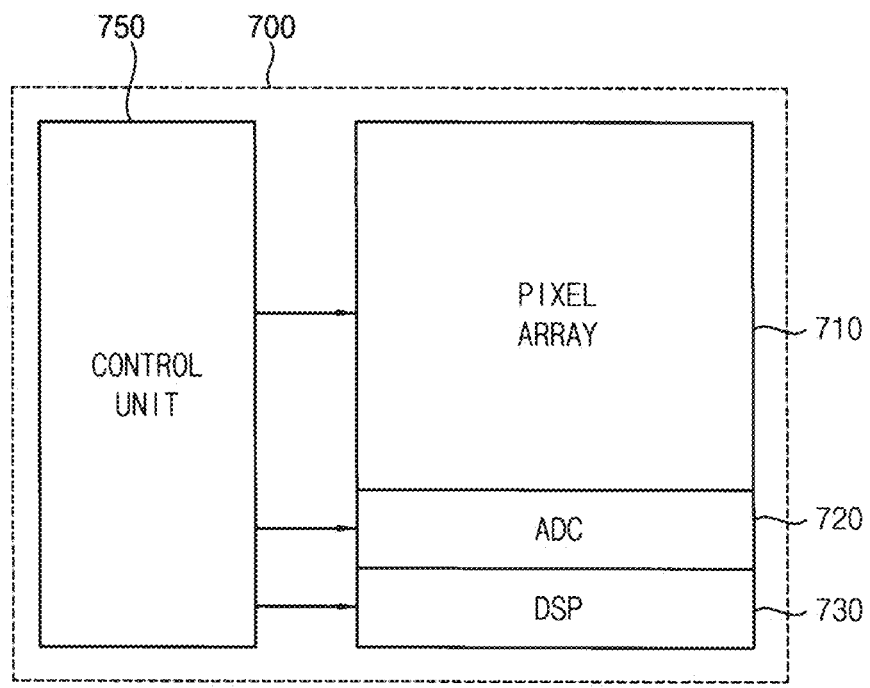
FIG. 10 is a block diagram of an image sensor according to the inventive concept.
Figure 11:
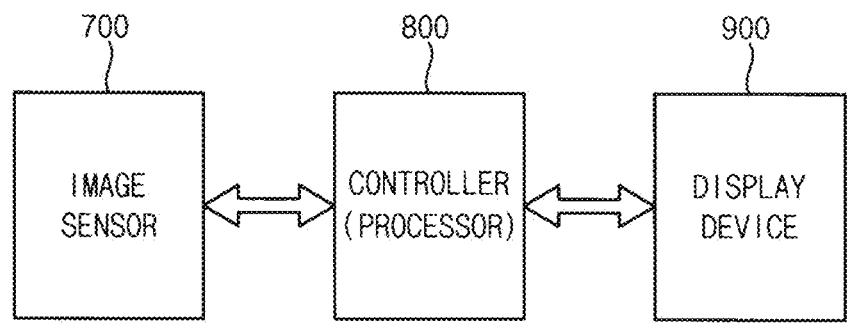
FIG. 11 is a block diagram of an image system, in which the image sensor of FIG. 10 is connected to a display device via a controller, according to the inventive concept.

FIG. 10 is a block diagram of an image sensor according to the inventive concept, and FIG. 11 is a block diagram illustrating an example in which the image sensor of FIG. 10 is connected to a display device via a controller.

Referring to FIG. 10, an image sensor 700 may include a pixel array 710 and a control unit 750. In an example of this embodiment, the image sensor 700 also includes an analog-to-digital conversion (ADC) unit 720 and a digital signal processing (DSP) unit 730.

The pixel array 710 may include a plurality of pixels arranged in a matrix (a plurality of rows and a plurality of columns) Each pixel may include a photoelectric conversion region, a floating diffusion region, a vertical transfer gate and an impurity region of an embodiment according to the inventive concept as described above. Thus, the impurity region may have a first impurity concentration at a region adjacent to a side surface of a buried region of the vertical transfer gate, and may have a second impurity concentration higher than the first impurity concentration at a region adjacent to a bottom surface of the buried region of the vertical transfer gate. Accordingly, a potential barrier at a transfer channel of the vertical transfer gate may be virtually non-existent, transfer performance of the vertical transfer gate may be enhanced, and a transfer delay and an image lag may be prevented.

The ADC unit 720 may convert an analog signal output from the pixel array 710 into a digital signal. The ADC unit 720 may perform a column ADC that converts the analog signals in parallel by using a plurality of analog-to-digital converters respectively coupled to a plurality of column lines of the pixel array 710, or may perform a single ADC that sequentially converts the analog signals by using a single analog-to-digital converter.

In an example of this embodiment, the ADC unit 720 includes a correlated double sampling (CDS) unit for extracting an effective signal component. In an example of this embodiment, the CDS unit may perform an analog double sampling that extracts the effective signal component based on a difference between an analog reset signal including a reset component and an analog data signal including a signal component. In another example, the CDS unit may perform a digital double sampling that converts the analog reset signal and the analog data signal into two digital signals and extracts the effective signal component based on a difference between the two digital signals. In still another example, the CDS unit may perform a dual correlated double sampling that performs both the analog double sampling and the digital double sampling.

The DSP unit 730 may receive a digital image signal output from the ADC unit 720, and may perform image data processing on the digital image signal. For example, the DSP unit 730 may perform image interpolation, color correction, white balance, gamma correction, color conversion, etc. As illustrated in FIG. 11, the image sensor 700 may be connected to a display device 900 via a controller (or processor) 800. Thus, the display device 900 may display an image based on the image signal output from the DSP unit 730. Although FIG. 10 illustrates an example in which the DSP unit 730 is located inside the image sensor 700, the DSP unit 730 may be located outside the image sensor 700. For example, the DSP unit 730 may be implemented inside the controller 800, or may be implemented independently (or separately) from the image sensor 700 and the controller 800.

The control unit 750 may control the pixel array 710, the ADC unit 720 and the DSP unit 730. The control unit 750 may provide the pixel array 710, the ADC unit 720 and the DSP unit 730 with control signals, such as a clock signal, a timing control signal, or the like. In examples of this embodiment, the control unit 750 includes a control logic circuit, a phase locked loop (PLL) circuit, a timing control circuit, a communication interface circuit, or the like.

Although not illustrated in FIG. 10, the image sensor 700 may also include a row decoder that selects a row line of the pixel array 710, and a row driver that activates the selected row line. In an example of this embodiment, the image sensor 700 also includes a column decoder that selects one of a plurality of analog-to-digital converters of the ADC unit 720, and a column driver that provides an output of the selected analog-to-digital converter to the DSP unit 730 or an external host (e.g., the controller 800).

Figure 12:
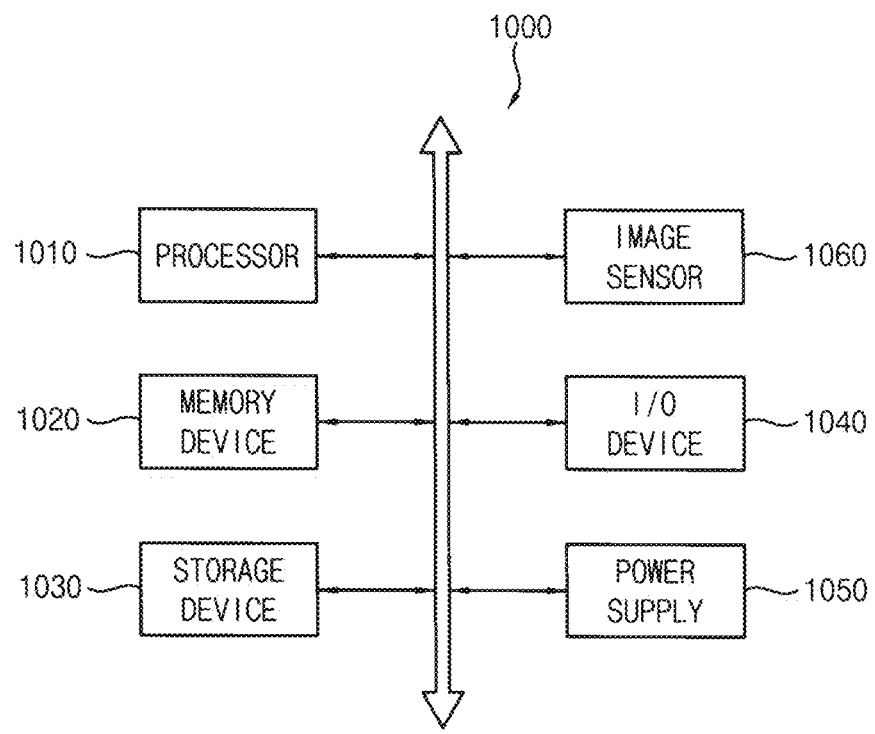
FIG. 12 is a block diagram of an electronic device according to the inventive concept.
Figure 13A:
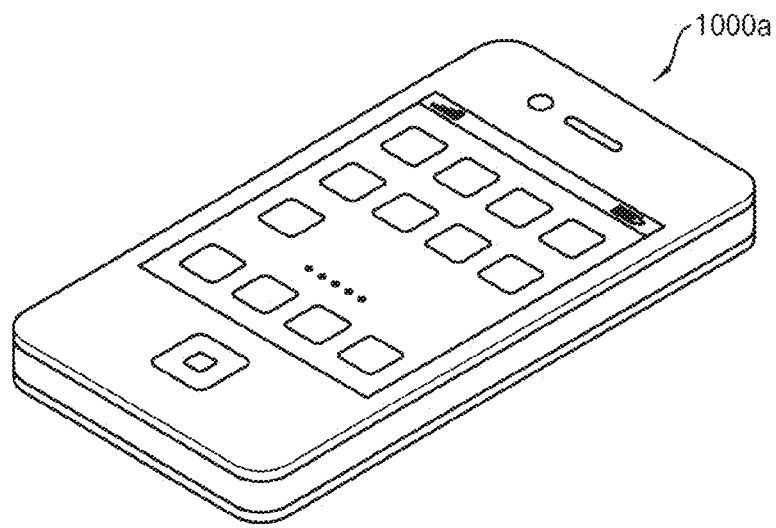
FIG. 13A is a perspective view of a smart phone which employs the electronic device of FIG. 12 according to the inventive concept.
Figure 13B:
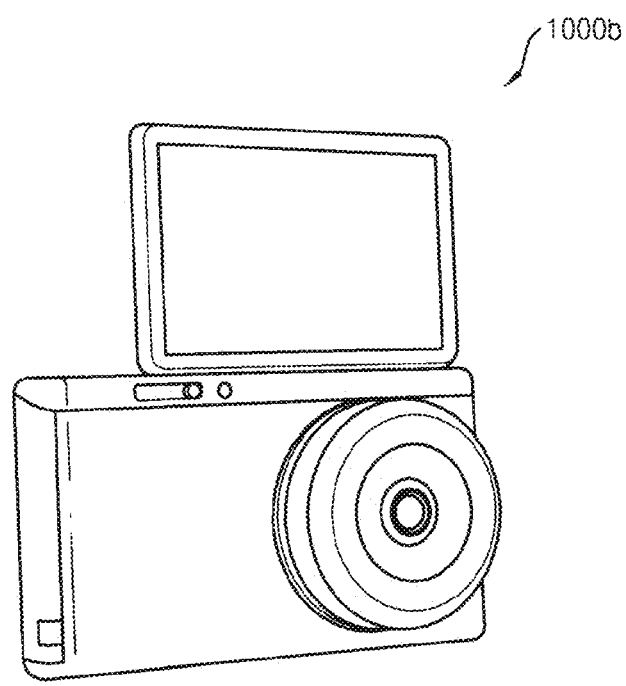
FIG. 13B is a perspective view of a digital camera which employs the electronic device of FIG. 12 according to the inventive concept.

FIG. 12 is a block diagram illustrating an electronic device 1000 according to the inventive concept. FIG. 13A illustrates the electronic device of FIG. 12 realized in the form of a smart phone 1000*a*, and FIG. 13B illustrates the electronic device of FIG. 12 realized in the form of a digital camera 1000*b*. However, the electronic device 1000 can be realized as any electronic device including an image sensor. For example, the electronic device 1000 may be realized as a cellular phone, a smart pad, a personal digital assistant (PDA), a portable multimedia player (PMP), etc. That is, as will be clear from the foregoing and following descriptions, the inventive concept may be applied to an image sensor, or an electronic device comprising an image sensor. For example, the inventive concept may be applied to a computer, a laptop, a digital camera, a cellular phone, a smart phone, a smart pad, a tablet PC, a personal digital assistants (PDA), a portable multimedia player (PMP), a navigation system, or a video phone, for example.

Referring to FIGS. 12 through 13B, electronic device 1000 may include a processor 1010, a memory device 1020, a storage device 1030, an input/output (I/O) device 1040, a power supply 1050, and an image sensor 1060. The electronic device 1000 may also include a plurality of ports for facilitating communication with a video card, a sound card, a memory card, a universal serial bus (USB) device, other electronic devices, etc.

The processor 1010 may perform various computing functions. The processor 1010 may be a micro-processor, a central processing unit (CPU), an application processor (AP), or the like. The processor 1010 may be coupled to the memory device 1020, the storage device 1030, and the I/O device 1040 via an address bus, a control bus, a data bus, or the like. In an example of this embodiment, the processor 1010 is coupled to an extended bus such as a peripheral component interconnection (PCI) bus. The memory device 1020 may store data used in operations of the electronic device 1000. For example, the memory device 1020 may include a volatile semiconductor memory device such as a dynamic random access memory (DRAM) device, a static random access memory (SRAM) device, or a mobile DRAM, and a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, or a ferroelectric random access memory (FRAM) device. The storage device 1030 may include a solid state drive (SSD) device, a hard disk drive (HDD) device, a CD-ROM device, or the like.

The I/O device 1040 may include an input device such as a keyboard, a keypad, a touchpad, a touch-screen, a mouse, etc., and an output device such as a display device, a printer, a speaker, etc. The power supply 1050 may supply power for operating the electronic device 1000. The image sensor 1060 may be coupled to other components via the buses or other communication links. The image sensor 1060 has pixels according to the inventive concept, i.e., as described above with reference to FIG. 1, 2, 5-7, 8 or 9, for example. Accordingly, a potential barrier at a transfer channel of the vertical transfer gate of each pixel is virtually non-existent, transfer performance of the vertical transfer gate is enhanced, and a transfer delay and an image lag may be prevented. Accordingly, the electronic device 1000 including the image sensor 1060 may output a high-quality image.

In an example of this embodiment, the image sensor 1060 may be embodied in any of various types of packages such as a Package on Package (PoP), Ball grid array (BGA), Chip scale package (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), or Wafer-Level Processed Stack Package (WSP).

In one example, the image sensor 1060 and the processor 1010 are integrated in a single chip. In another example, the image sensor 1060 and the processor 1010 constitute different chips, respectively.

FIG. 14 illustrates the electronic device 1000 of FIG. 12 realized as a portable electronic device provided with or supporting several interfaces.

Referring to FIG. 14, the portable electronic device 1000 uses or supports a mobile industry processor interface (MIPI) interface (of a mobile phone, a personal digital assistant (PDA), a portable multimedia player (PMP), or a smart phone, for example). The electronic device 1000 may include an application processor 1010, an image sensor 1140, a display device 1150, and other various input/output devices described in detail below. A CSI host 1112 of the application processor 1110 may perform a serial communication with a CSI device 1141 of the image sensor 1140 using a camera serial interface (CSI). For example, the CSI host 1112 may include a light deserializer (DES), and the CSI device 1141 may include a light serializer (SER). A DSI host 1111 of the application processor 1110 may perform a serial communication with a DSI device 1151 of the display device 1150 using a display serial interface (DSI). For example, the DSI host 1111 may include a light serializer (SER), and the DSI device 1151 may include a light deserializer (DES). The electronic device 1000 may additionally include a radio frequency (RF) chip 1160. The RF chip 1160 may communicate with the application processor 1110. A physical layer (PHY) 1113 of the portable electronic device 1000 and a physical layer (PHY) 1161 of the RF chip 1160 may perform data communications based on a MIPI DigRF. The application processor 1110 may additionally include a DigRF MASTER 1114 that controls the data communications of the PHY 1161. The electronic device 1000 may include a global positioning system (GPS) 1120, a storage 1170, a MIC 1180, a DRAM device 1185, and a speaker 1190. The portable electronic device 1000 may perform communications using an ultra wideband (UWB) 1210, a wireless local area network (WLAN) 1220, a worldwide interoperability for microwave access (WIMAX) 1230, etc.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:
1. A pixel comprising:
   a photoelectric conversion region in a semiconductor substrate having first and second opposite major surfaces, the photoelectric conversion region being spaced from the first surface such that the top of the photoelectric conversion region faces towards the first surface;

a floating diffusion region in the semiconductor substrate, the floating diffusion region being vertically spaced relative to the photoelectric conversion region in the pixel;

a vertical transfer gate extending from the first surface of the semiconductor substrate into a recess in the semiconductor substrate, the vertical transfer gate being disposed atop the photoelectric conversion region, and the vertical transfer gate being operable to form a transfer channel between the photoelectric conversion region and the floating diffusion region; and an impurity region surrounding the recess, the impurity region having a first region extending facing a side of the recess above the photoelectric conversion region and interposed between the transfer gate and the floating diffusion region, and a second region facing a bottom of the recess as interposed between the upper surface of the photoelectric conversion region and a surface of the vertical transfer gate that faces towards the second surface of the substrate, and the impurity region also having a bend therein, the bend forming a corner at which the first and second regions join one another, and wherein the transfer channel, along which charges transfer to the floating diffusion region from the photoelectric conversion region, includes the bend and the first region of the impurity region, and the first region of the impurity region has a first impurity concentration, and the second region of the impurity region has a second impurity concentration higher than the first impurity concentration.

2. The pixel of claim 1, wherein the vertical transfer gate has a buried portion in the recess such that the buried portion is surrounded by the semiconductor substrate, and the buried portion of the vertical transfer gate has a corner at which a bottom surface of the buried portion and a side surface of the buried portion intersect and subtend an angle.

3. The pixel of claim 1, wherein the vertical transfer gate has a buried portion in the recess such that the buried region is surrounded by the semiconductor substrate, and the buried portion of the vertical transfer gate has a rounded corner between a bottom surface of the buried region and a side surface of the buried portion.

4. The pixel of claim 3, wherein the rounded corner has a radius of curvature in a range of 10 nm to 100 nm.

5. The pixel of claim 1, further comprising:

a gate insulation layer interposed between the vertical transfer gate and the impurity region.

6. The pixel of claim 1, further comprising:

a reset transistor configured to reset the floating diffusion region in response to a reset signal;

a drive transistor configured to generate an output signal based on charges accumulated in the floating diffusion region; and a select transistor configured to output the output signal in response to a selection signal.

7. A pixel array including a pixel as claimed in claim 6 and an adjacent pixel, wherein the reset transistor, the drive transistor and the select transistor are shared in common by the pixels.

8. A backside illumination (BSI) image sensor including a pixel as claimed in claim 6.

9. The backside illumination sensor of claim 8, further comprising:

a color filter disposed on the second surface of the semiconductor substrate opposite to the first surface of the semiconductor substrate.

10. The backside illumination sensor of claim 9, further comprising:

a micro lens disposed on the color filter.

11. A pixel array comprising:

a semiconductor substrate having first and second opposite major surfaces, and a recess extending into the substrate from the first surface, whereby the recess has a bottom at which the recess terminates within the substrate, a photodetector whose top is disposed adjacent the bottom of the recess, and a vertical transfer gate extending into the recess so as to be disposed atop the photodetector, and wherein the substrate also has a floating diffusion region adjacent the side of the recess as vertically spaced relative to the photodetector in the pixel array, and an impurity region including a first portion delimiting the bottom of the recess, a second portion delimiting a side of the recess extending from the first surface of the substrate above the top of the photodetector, and a bend forming a corner at which the first and second portions are connected to one another such that the impurity region is interposed between the vertical transfer gate and the floating diffusion region and such that the first portion, the second portion and the bend of the impurity region provide a channel from the top of the photodetector adjacent the bottom of the recess to the floating diffusion region, the impurity region is of a first conductivity type, the floating diffusion region is of a second conductivity type different from the first conductivity type, and the impurity region contains an impurity at a first concentration in the first portion thereof delimiting the side of the recess, and at a second concentration in the second portion thereof delimiting the bottom of the recess, the second concentration being greater than the first concentration.

12. The pixel array of claim 11, wherein the vertical transfer gate has a buried portion extending within the recess and around which the first portion of the impurity region having the first concentration of the impurity extends, whereby the buried portion has a side surface facing the side of the recess and a bottom surface facing the bottom of the recess, and the bottom surface of the buried portion and the side surface of the buried portion intersect at and thereby subtend an angle.

13. The pixel array of claim 11, wherein the vertical transfer gate has a buried portion extending within the recess and around which the first portion of the impurity region having the first concentration of the impurity extends, whereby the buried portion has a side surface facing the side of the recess and a bottom surface facing the bottom of the recess, and the buried portion of the vertical transfer gate has a rounded corner between the bottom surface of the buried region and the side surface of the buried portion.

14. The pixel array of claim 13, wherein the rounded corner has a radius of curvature in a range of 10 nm to 100 nm.

15. The pixel array of claim 11, wherein the photodetector comprises a pinned photodiode (PPD), photodiode (PD), a phototransistor or a photogate.

16. An image sensor comprising the pixel array as claimed in claim 11, and a control unit operatively connected to the pixel array.

17. An image sensor, comprising:

a pixel array including a plurality of pixels; and a control unit configured to control the pixel array, and wherein each pixel includes:
- a photoelectric conversion region in a semiconductor substrate having first and second opposite major surfaces, the photoelectric conversion region being spaced from the first surface such that the top of the photoelectric conversion region faces towards the first surface,
- a floating diffusion region in the semiconductor substrate, the floating diffusion region being vertically spaced relative to the photoelectric conversion region in the pixel,
- a vertical transfer gate extending from a first surface of the semiconductor substrate into a recess in the semiconductor substrate, the vertical transfer gate being disposed atop the photoelectric conversion region, and the vertical transfer gate being operable to form a transfer channel between the photoelectric conversion region and the floating diffusion region, and
- an impurity region surrounding the recess as interposed between the photoelectric conversion region and the floating diffusion region, the impurity region having a first region facing a side of the recess above the photoelectric conversion region and interposed between the transfer gate and the floating diffusion region, and a second region facing a bottom of the recess so as to be interposed between the top of the photoelectric conversion region and a surface of the vertical transfer gate that faces towards the second surface of the substrate, and the impurity region also having a bend therein, the bend forming a corner at which the first and second regions join one another, and
- wherein the transfer channel, along which charges transfer to the floating diffusion region from the photoelectric conversion region, includes the bend and the first region of the impurity region, and
- the first region of the impurity region has a first impurity concentration, and the second region of the impurity region has a second impurity concentration higher than the first impurity concentration.

18. The image sensor of claim 17, wherein the vertical transfer gate of the pixel has a buried portion in the recess such that the buried portion is surrounded by the semiconductor substrate, and
- the buried portion of the vertical transfer gate has a corner at which a bottom surface of the buried portion and a side surface of the buried portion intersect and subtend an angle.

19. The image sensor of claim 17, wherein the vertical transfer gate of the pixel has a buried portion in the recess such that the buried region is surrounded by the semiconductor substrate, and
- the buried portion of the vertical transfer gate has a rounded corner between a bottom surface of the buried region and a side surface of the buried portion.

20. The image sensor of claim 19, wherein the rounded corner has a radius of curvature in a range of 10 nm to 100 nm.

* * * * *